United States Patent [19]

Ragland, Jr.

[11] 4,295,074

[45] Oct. 13, 1981

[54] MERCURY ARC LAMP HAVING COMMUNICATING MERCURY RESERVOIR

[75] Inventor: Frank R. Ragland, Jr., Lancaster, Pa.

[73] Assignee: RCA Corporation, New York, N.Y.

[21] Appl. No.: 22,617

[22] Filed: Mar. 21, 1979

[51] Int. Cl.³ .................. H01J 61/28; H01J 61/30
[52] U.S. Cl. ............................. 313/174; 313/180; 313/227
[58] Field of Search ............... 313/174, 180, 184

[56] References Cited

U.S. PATENT DOCUMENTS

| 1,971,939 | 8/1934 | Pirani | 313/180 X |
| 2,307,502 | 1/1943 | Gordon et al. | 315/12 |
| 2,961,564 | 11/1960 | Kenty | 313/174 |
| 4,156,826 | 5/1979 | Hernqvist | 313/221 |

FOREIGN PATENT DOCUMENTS

| 1133824 | 7/1962 | Fed. Rep. of Germany | 313/174 |
| 45-20752 | 7/1970 | Japan | 313/174 |
| 767395 | 2/1957 | United Kingdom | 313/180 |

*Primary Examiner*—Robert Segal
*Attorney, Agent, or Firm*—Eugene M. Whitacre; Dennis H. Irlbeck; Vincent J. Coughlin, Jr.

[57] ABSTRACT

A mercury arc lamp envelope has a first internal bore including a pair of spaced apart regions with lead-in conductors terminating in electrodes, said conductors being sealed in said envelope and extending through said regions. Pools of mercury are retained within the regions and around the electrodes. At least one chamber, having a reservoir of mercury, communicates through a second internal bore with one of the regions. The chamber is remote from the regions.

5 Claims, 4 Drawing Figures

MERCURY ARC LAMP HAVING COMMUNICATING MERCURY RESERVOIR

BACKGROUND OF THE INVENTION

This invention relates to high pressure discharge devices and particularly to an improved envelope configuration for devices such as mercury arc lamps and to a method for controlling the lamp impedance and increasing the lamp life. Such lamps have particular application in the manufacture of television picture tubes and in integrated circuit fabrication.

Commercially available mercury arc lamps comprise a sealed fused quartz tubular envelope having lead-in conductors sealed through and extending a short distance into the envelope and terminating in electrodes of the same material as the lead-in conductors. The lamps further comprise pools of mercury contained within the envelope and positioned in chambers at the ends of the envelope surrounding the electrodes. Such lamps exhibit a limited useful life of about 100 hours because of devitrification of the fused quartz envelope and because of an increase in lamp impedance. Devitrification means a change in the glass-like properties of the envelope material, particularly the transparency.

A solution to the devitrification problem was addressed in copending application Ser. No. 901,821, filed May 1, 1978 by Carl G. Hernqvist and entitled "Improved Mercury Arc Lamps." That application discloses that devitrification can be controlled and lamp life extended to several hundred hours by using fused silica rather than fused quartz as the envelope material, wherein the fused silica has a total metallic impurity of less than one part per million by weight and an OH radical content of less than 5 parts per million by weight. The charge in envelope material, however, did not eliminate the problem of increased lamp impedance during operation.

The problem of increased lamp impedance is addressed by the present invention. The cause of increased lamp impedance is not precisely known, but it is thought to be due to the progressive increase in vapor pressure within the lamp. As the distance from the electrode tips to the face of the mercury pools decreases, more mercury is vaporized causing an increase in vapor pressure and an increase in impedance. The distance change could be the result of electrode erosion either from extended lamp life in those lamps using the fused silica envelope, or in conventional lamps using the fused quartz envelope, from higher lamp power required to maintain a constant lamp brightness as the transmission of the fused quartz decreases due to devitrification. Also, the inability to accurately fill the lamps with mercury causes some lamps which are over-filled to initially have a relatively high impedance which continues to increase during operation.

SUMMARY OF THE INVENTION

An improved mercury arc lamp comprises an envelope having a small internal bore including a pair of spaced apart regions, pools of mercury are retained within said regions. At least one chamber having a reservoir of mercury therein is remote from said regions but communicates with one of said regions.

DETAILED DESCRIPTION OF THE PREFERRED EMBODIMENT

Figure 1:
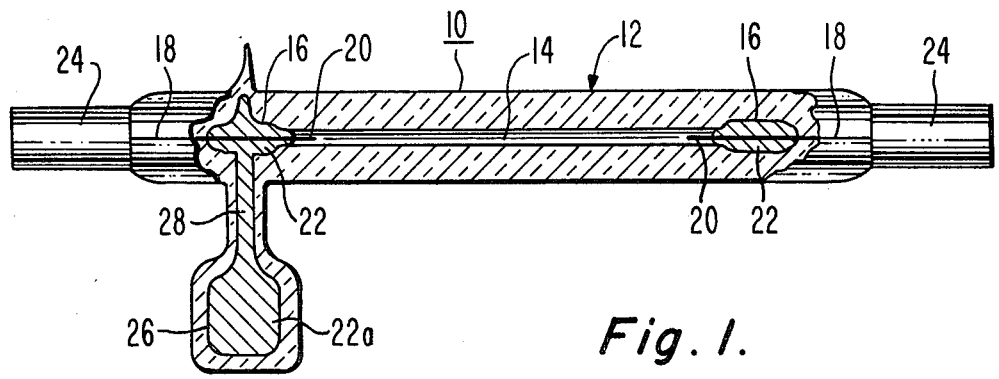
FIGS. 1-4 are partial cross-sections of mercury arc lamps illustrating four different embodiments of the present invention.

Referring to FIG. 1, an improved mercury arc lamp 10 comprises an envelope 12 of fused silica as described in copending application Ser. No. 901,821 filed May 1, 1978, having a first small internal bore 14 with a diameter of the order of a few millimeters. The envelope 12 is substantially cylindrical along its longitudinal axis and includes a pair of spaced apart first chambers or regions 16, each of said first chambers having a diameter greater than the diameter of the internal bore 14. The envelope 12 also has lead-in conductors 18 sealed in and extending through the ends thereof terminating in electrodes 20 which are an extension of the lead-in conductors. The electrodes 20 protrude slightly from the ends of the first chambers 16. The lamp 10 further comprises pools 22 of mercury positioned in the first chambers 16 surrounding the electrodes 20. Metal sleeves 24 attached to the lead-in conductors 18 provide external terminals which permit a potential to be applied to electrodes 20.

An appendaged second chamber 26 is non-coaxial with, but connected to one of the first chambers 16 by a second small internal bore 28 to provide a reservoir 22a of mercury. The second small internal bore 28 has a diameter substantially equal to the diameter of the first internal bore 14.

An arc operates between the two electrodes 20. An external power supply provides a voltage to metal sleeves 24 for initiation of the arc and for sustaining operation. The heat of the arc causes the pools 22 of mercury to vaporize thereby increasing the vapor pressure in the envelope 12 to a very high value which may approach 100 atmospheres.

Normally, a fluid is made to impinge on the external lamp surface near the electrodes 20 for the purpose of cooling the lamp. Heat is also conducted through the electrodes 20 and conductors 18, the mercury pools 22 and the envelope 12 towards the ends of the lamp 10. Differential expansion between the envelope 12 and the mercury pools 22 causes the face of the mercury pools to move relative to the tips of the electrodes 20.

Since the appendaged second chamber 26 is remote from the cooling applied to the electrodes 20, its temperature may be independently controlled by either heating or cooling the second chamber 26. For example, a fluid of the desired temperature may be selectively directed onto the envelope 12 adjacent the second chamber 26. The second chamber 26 may also be surrounded by heating or cooling coils (not shown) or by similar structures which will restrictedly vary the temperature of the envelope 12 adjacent the chamber 26 to selectively change the temperature of the mercury reservoir 22a within the second chamber 26.

Cooling of the second chamber 26 causes the mercury 22a therein to contract relative to the envelope 12 and withdraw mercury from the first chambers 16. This in turn causes the distance from the face of mercury pools 22 to the electrodes 20 to increase and thus causes the vapor pressure and the lamp impedance to decrease. Similarly, heating of the second chamber 26 causes the mercury to expand relative to the envelope 12 and increases the volume of mercury in chambers 16. This in turn decreases the distance from the face of mercury pools 22 to the electrodes 20 and causes the vapor pressure and the lamp impedance to increase. This increase in impedance may be useful in aiding lamp start-up.

The distance from the face of the mercury pools 22 to the electrodes 20 tends to equalize at both electrodes 20 due to the continuous vaporization and condensation of the mercury.

In the preferred embodiment, the appendaged second chamber 26 has a length of about 5 mm and a diameter of about 4 mm. This chamber dimension permits a change in the mercury pool face of about 0.007 inches (0.18 mm) for a 10° C. temperature change of the second chamber 26. The length of the internal bore 28 connecting the first chamber 16 and the second chamber 26 should be at least 5 mm.

The structure described above permits the distance from the electrodes 20 to the face of the mercury pools 22 to be controlled by external means while the lamp 10 is operating.

Figure 2:
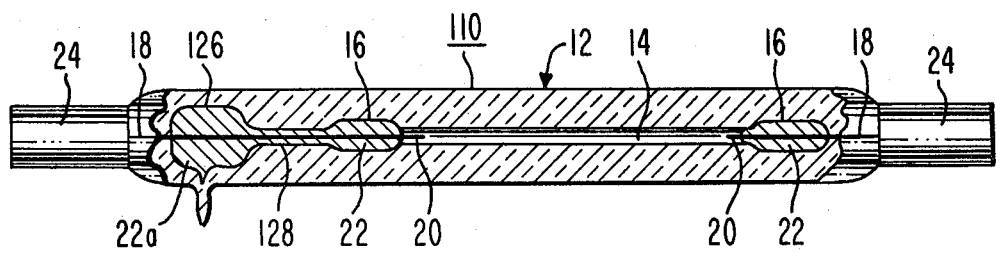
Figure 3:
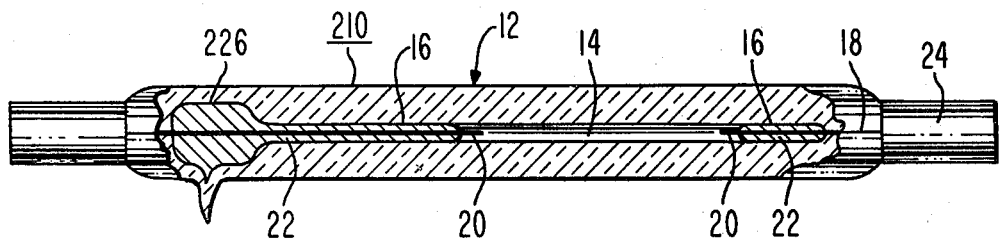
Figure 4:
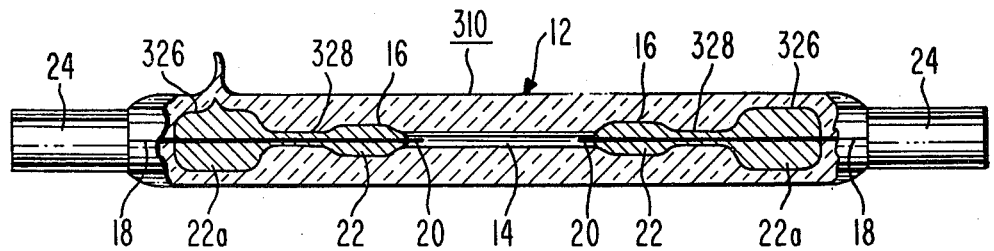

Other lamp configurations are shown in FIGS. 2-4. In FIG. 2 a second embodiment includes a mercury arc lamp 110 similar to lamp 10 described above having a second chamber 126 with the same dimensions as the second chamber 26 in the preferred embodiment. In the second embodiment, the second chamber 126 is coaxial with the first chambers or regions 16 and connected with one of the first chambers 16 by a second small internal bore 128. The length of the internal bore 128 connecting the first chamber 16 and the second chamber 126 should be at least 5 mm. The advantage of the second embodiment is that the coaxial second chamber 126 is less susceptible to damage than the appendaged second chamber 26 of the preferred embodiment.

A third lamp configuration is shown in FIG. 3. In this configuration, a mercury arc lamp 210, similar to lamp 10 described above, has a second chamber 226 having the same dimensions as the second chamber 26 in the preferred embodiment. The third embodiment permits a simplified construction by making the diameter of the first chambers or regions 16 substantially equal to the diameter of the first small internal bore 14, and provides a greater isolation of the mercury chamber 226 from the active part of the lamp between electrodes 20 by increasing the separation between the chamber 226 and adjacent electrode 20 by at least 5 mm.

A fourth lamp configuration is shown in FIG. 4. In this configuration, a mercury arc lamp 310 similar to lamp 110 described above in FIG. 2 has a pair of second chambers 326. Each of the chambers 326 has the same dimensions as the second chamber 26 of FIG. 1, and each of the chambers 326 is connected with a different one of the first chambers 16 by a second small internal bore 328. The advantage of this fourth embodiment is that the pair of second chambers 326 provides twice the impedance range provided by the other embodiments shown in FIGS. 1-3.

The impedance of the lamps shown in FIGS. 2-4 may be controlled by independently heating or cooling the second chambers, as described above for chamber 26 of the preferred embodiment.

I claim:

1. In a high pressure mercury discharge device including an envelope having a first internal bore including a pair of spaced apart regions, said envelope having lead-in conductors terminating in electrodes, said conductors being sealed in said envelope and extending through said regions, and having pools of mercury retained within said regions around said electrodes, the improvement comprising
    at least one chamber having a reservoir of mercury therein, and a second integral bore communicating between said chamber and one of said regions, said chamber being substantially larger than second integral bore, said chamber being remote from said regions whereby said chamber can be selectively heated or cooled independently of said regions to vary the impedance of said device.

2. The high pressure mercury discharge device as described in claim 1 wherein said chamber has a diameter larger than said regions.

3. A high pressure mercury discharge device as described in claim 2 wherein said second bore has a length of at least 5 mm.

4. A high pressure mercury discharge device as described in claim 3 wherein said second bore has a diameter substantially equal to the diameter of said first bore.

5. A high pressure mercury discharge device as described in claim 4 wherein said chamber is coaxial with said regions.

* * * * *